United States Patent
Yamamoto et al.

(10) Patent No.: US 11,611,265 B2
(45) Date of Patent: Mar. 21, 2023

(54) ELECTRIC COMPRESSOR

(71) Applicant: KABUSHIKI KAISHA TOYOTA JIDOSHOKKI, Aichi-ken (JP)

(72) Inventors: Kouki Yamamoto, Aichi-ken (JP); Mikio Yoshida, Aichi-ken (JP); Kenji Hayakawa, Aichi-ken (JP); Takuya Sagawa, Aichi-ken (JP); Yusuke Kinoshita, Aichi-ken (JP); Shunsuke Ambo, Aichi-ken (JP); Junya Kaida, Aichi-ken (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 136 days.

(21) Appl. No.: 17/223,527

(22) Filed: Apr. 6, 2021

(65) Prior Publication Data

US 2021/0320566 A1 Oct. 14, 2021

(30) Foreign Application Priority Data

Apr. 10, 2020 (JP) .............................. JP2020-071235

(51) Int. Cl.
| | |
|---|---|
| *H02K 11/33* | (2016.01) |
| *H03H 7/42* | (2006.01) |
| *H02K 5/06* | (2006.01) |
| *B60H 1/32* | (2006.01) |
| *H01F 27/28* | (2006.01) |
| *H01F 17/00* | (2006.01) |

(52) U.S. Cl.
CPC ........... *H02K 11/33* (2016.01); *B60H 1/3222* (2013.01); *H01F 27/288* (2013.01); *H02K 5/06* (2013.01); *H03H 7/427* (2013.01); *H01F 2017/0093* (2013.01); *H02K 2211/03* (2013.01)

(58) Field of Classification Search
CPC ................ H02K 11/33; H02K 2211/03; H01F 27/88–27/2885
See application file for complete search history.

(56) References Cited

U.S. PATENT DOCUMENTS

| | | |
|---|---|---|
| 2013/0027164 A1 | 1/2013 | Ooyama |
| 2019/0305648 A1 | 10/2019 | Ambo et al. |
| 2020/0298654 A1 | 9/2020 | Kagawa et al. |

FOREIGN PATENT DOCUMENTS

| | | |
|---|---|---|
| DE | 3325905 A1 | 1/1985 |
| JP | 2019-187228 | 10/2019 |
| KR | 10-2018-0115788 | 10/2018 |

*Primary Examiner* — Ramon M Barrera

(74) *Attorney, Agent, or Firm* — Greenblum & Bernstein, P.L.C.

(57) ABSTRACT

An electric compressor includes a compression part, an electric motor, an inverter device, and a housing. The inverter device includes an inverter circuit, a noise reduction unit, and a circuit board. The noise reduction unit includes a common mode choke coil and a smoothing capacitor. The common mode choke coil includes an annular core, a pair of winding wires, and an annular electrical conductor. The electrical conductor is split into a first metal plate and a second metal plate in a circumferential direction. The first metal plate is thermally coupled to the housing. The second metal plate is electrically connected to the first metal plate. An electrical resistance value of the first metal plate is larger than that of the second metal plate.

7 Claims, 9 Drawing Sheets

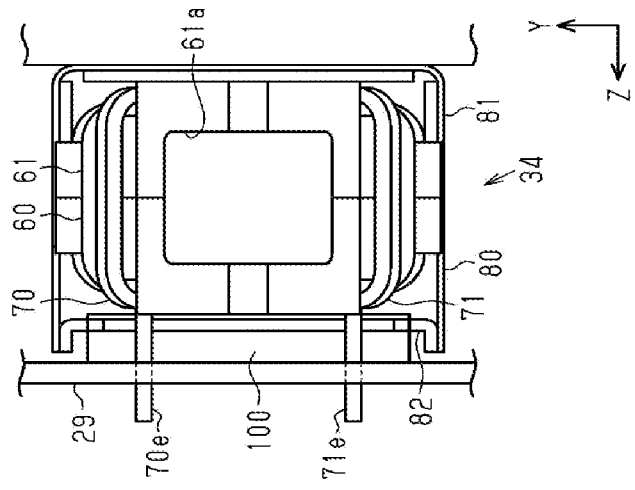
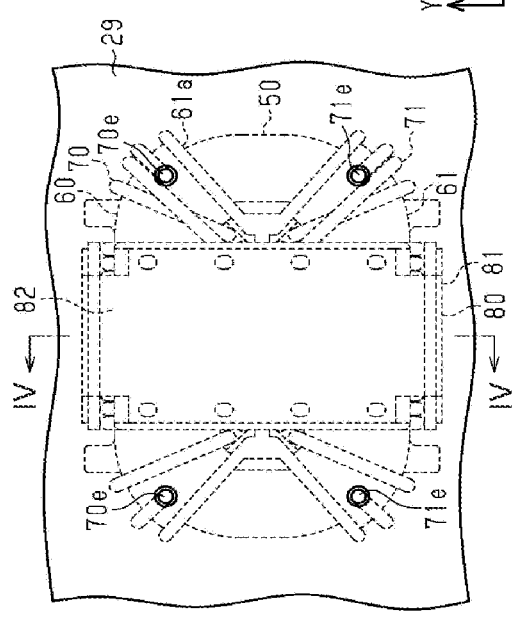
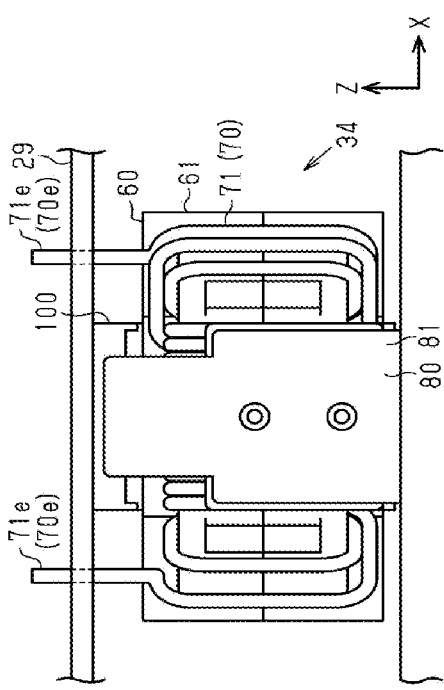

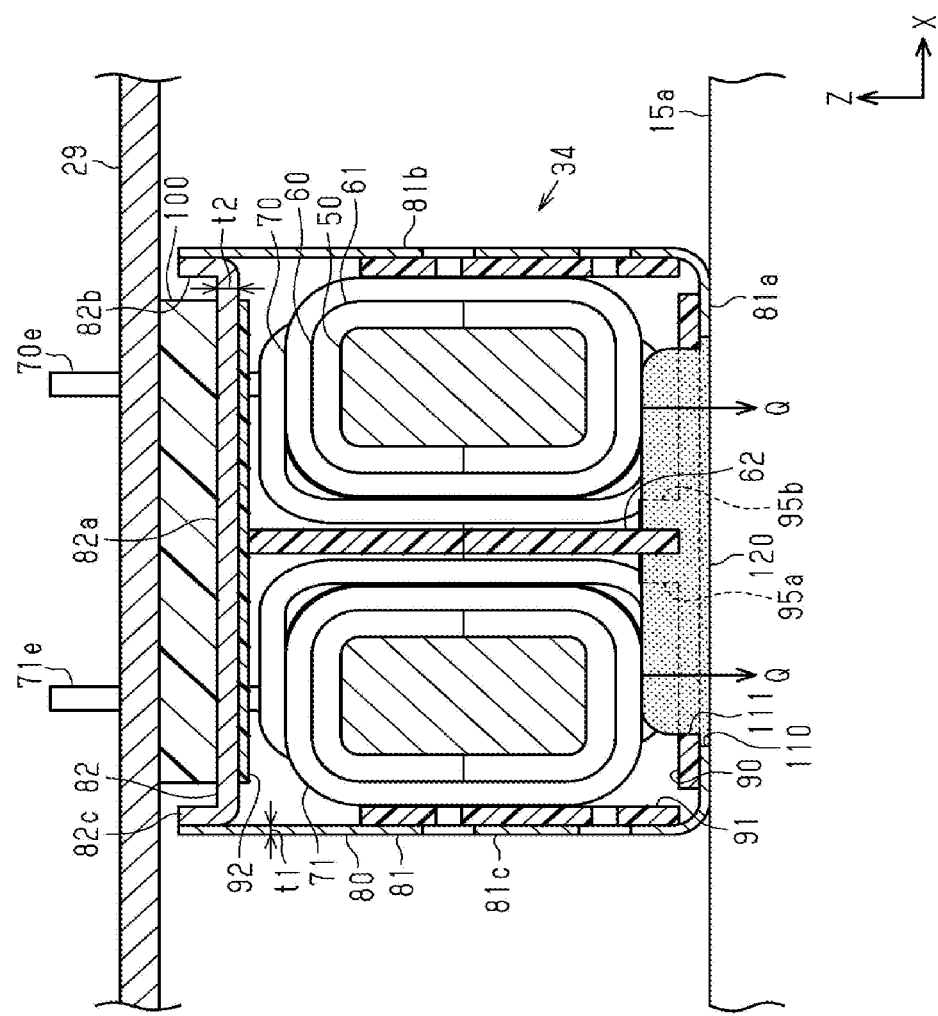

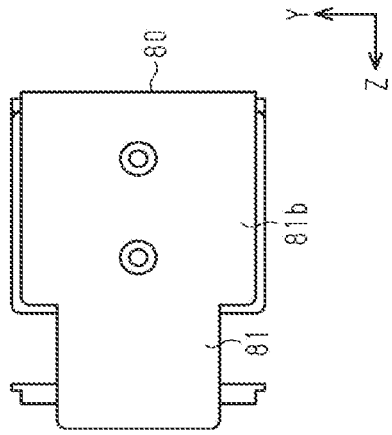
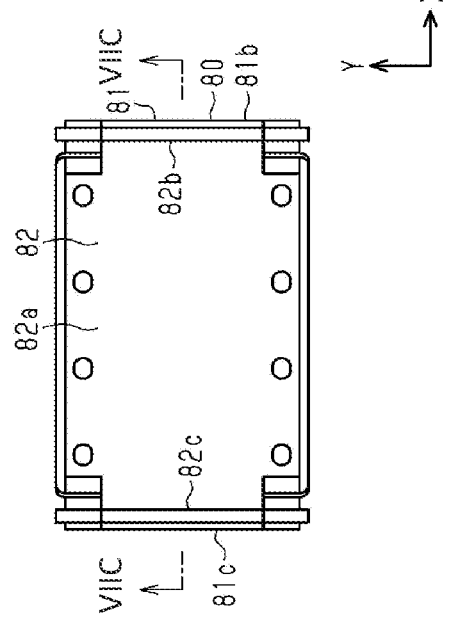
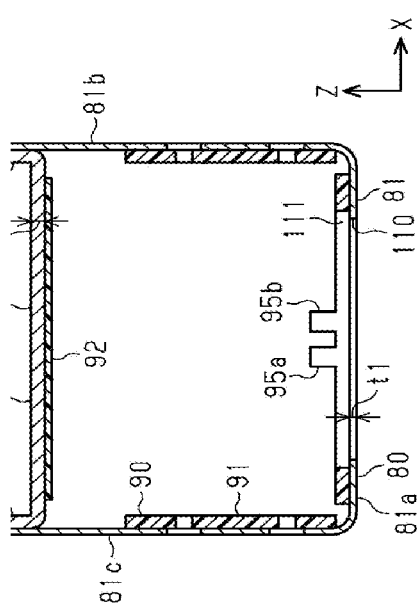

ELECTRIC COMPRESSOR

CROSS-REFERENCE TO RELATED APPLICATION

This application claims priority to Japanese Patent Application No. 2020-071235 filed on Apr. 10, 2020, the entire disclosure of which is incorporated herein by reference.

BACKGROUND ART

The present disclosure relates to an electric compressor.

A common mode choke coil is used for an inverter device that drives an electric motor in an electric compressor. Japanese Patent Application Publication No. 2019-187228 discloses a technique that converts a current generated with a leakage magnetic flux to heat in an annular electrical conductor by employing, as a configuration of the common mode choke coil, a structure in which the annular electrical conductor covers a core while looped over a pair of winding wires.

When employing the structure in which the pair of winding wires are wound around the core and the annular electrical conductor covers the pair of winding wires, heat is generated in the annular conductor, but the annular conductor has poor heat dissipation performance.

The present disclosure is directed to providing an electric compressor that is superior in heat dissipation performance.

SUMMARY

In accordance with an aspect of the present disclosure, there is provided an electric compressor that includes a compression part that compresses fluid, an electric motor that drives the compression part, an inverter device that drives the electric motor, and a housing that is made of metal and accommodates the compression part, the electric motor, and the inverter device. The inverter device includes an inverter circuit, a noise reduction unit that is connected to an input side of the inverter circuit and reduces a common mode noise and a normal mode noise in a DC current that is to be input to the inverter circuit, and a circuit board on which the inverter circuit and the noise reduction unit are mounted. The noise reduction unit includes a common mode choke coil and a smoothing capacitor that cooperates with the common mode choke coil to form a low pass filter circuit. The common mode choke coil includes an annular core, a pair of winding wires wound around the core, and an annular electrical conductor that covers the pair of the winding wires. The electrical conductor is split into a first metal plate and a second metal plate in a circumferential direction of the electrical conductor. The first metal plate is thermally coupled to the housing and disposed between the housing and the pair of the winding wires. The second metal plate is electrically connected to the first metal plate and disposed between the circuit board and the pair of the winding wires. An electrical resistance value of the first metal plate is larger than that of the second metal plate.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which:

FIG. 3A is a plan view of a circuit board and a common mode choke coil according to the embodiment of the present disclosure;

FIG. 3B is a front view of the circuit board and the common mode choke coil;

FIG. 3C is a right side view of the circuit board and the common mode choke coil;

FIG. 4 is a cross-sectional view taken along a line IV-IV of FIG. 3A;

FIG. 7A is a plan view of a metal plate according to the embodiment of the present disclosure;

FIG. 7B is a right side view of the metal plate;

FIG. 7C is a cross-sectional view taken along a line VIIC-VIIC of FIG. 7A;

DETAILED DESCRIPTION OF THE EMBODIMENTS

The following will describe an embodiment of the present disclosure with reference to the drawings. A vehicle electric compressor of the present embodiment includes a compression part configured to compress a refrigerant as fluid, and is used for a vehicle air conditioner. That is, the fluid that is compressed by the vehicle electric compressor in the present embodiment is a refrigerant.

Figure 1:
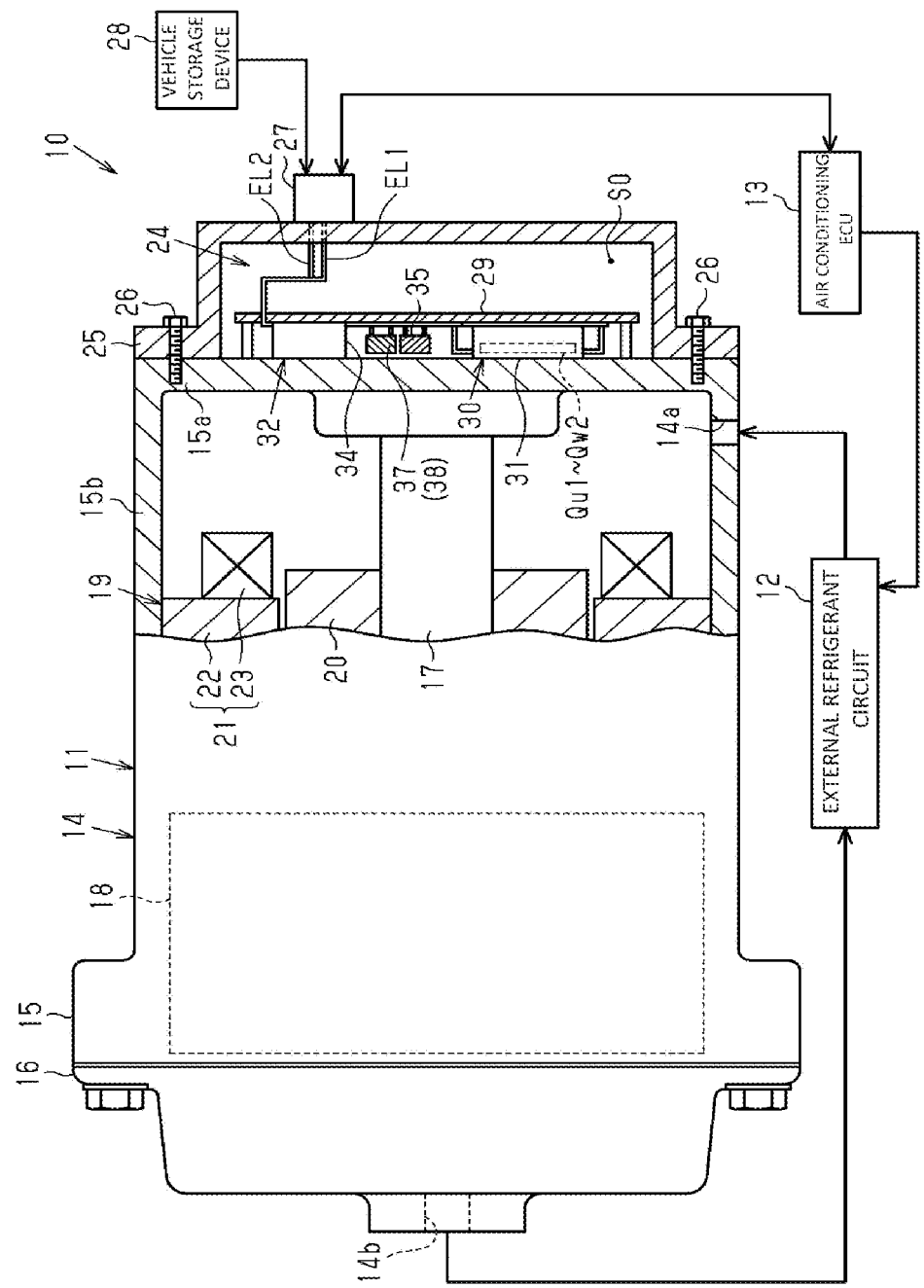
FIG. 1 is a schematic view illustrating a vehicle electric compressor according to an embodiment of the present disclosure.

As illustrated in FIG. 1, a vehicle air conditioner 10 includes a vehicle electric compressor 11 and an external refrigerant circuit 12 that supplies a refrigerant as fluid to the vehicle electric compressor 11. The external refrigerant circuit 12 has a heat exchanger and an expansion valve, for example. The refrigerant is compressed by the vehicle electric compressor 11 and heat exchange and expansion of the refrigerant are performed by the external refrigerant circuit 12, by which the vehicle air conditioner 10 performs air-conditioning in a vehicle.

The vehicle air conditioner 10 includes an air conditioning ECU 13 that controls the whole of the vehicle air conditioner 10. The air conditioning ECU 13 is configured in such a manner that the air conditioning ECU 13 monitors a temperature in the vehicle, a setting temperature of an air conditioner of the vehicle, and the like, and sends a variety of commands such as an ON/OFF command to the vehicle electric compressor 11 in accordance with these parameters.

The vehicle electric compressor 11 includes a housing 14 that has an inlet 14a through which the refrigerant is taken from the external refrigerant circuit 12.

The housing 14 is made of a material that has thermal conductivity, for example, metal such as aluminum. The housing 14 is electrically grounded to a body of the vehicle.

The housing 14 has a suction housing 15 and a discharge housing 16 that are assembled with each other. The housing 14 also has an inverter housing 25. The suction housing 15 is formed in a bottomed cylindrical shape that opens in one direction, and has a bottom wall portion 15a that is formed in a plate shape and a peripheral wall portion 15b that extends toward the discharge housing 16 from a peripheral edge portion of the bottom wall portion 15a. One example of the bottom wall portion 15a is formed in a substantially plate shape, and one example of the peripheral wall portion 15b is formed in a substantially cylindrical shape. The discharge housing 16 is assembled with the suction housing 15 with an opening of the suction housing 15 closed by the discharge housing 16. Thus, a space is formed in the housing 14.

The inlet 14a is formed in the peripheral wall portion 15b of the suction housing 15. In detail, the inlet 14a is disposed nearer the bottom wall portion 15a than the discharge housing 16 in the peripheral wall portion 15b of the suction housing 15.

The housing 14 has an outlet 14b through which the refrigerant is discharged. The outlet 14b is formed in the discharge housing 16, or, more specifically, in a portion of the discharge housing 16 that faces the bottom wall portion 15a.

The vehicle electric compressor 11 includes a rotary shaft 17, a compression part 18, and an electric motor 19 that are accommodated in the housing 14.

The rotary shaft 17 is rotatably supported by the housing 14. The rotary shaft 17 is disposed with an axial direction of the rotary shaft 17 being the same as a thickness direction of the bottom wall portion 15a formed in the plate shape (in other words, an axial direction of the peripheral wall portion 15b formed in a cylindrical shape). The rotary shaft 17 and the compression part 18 are coupled with each other.

The compression part 18 is disposed nearer the outlet 14b than the inlet 14a (in other words, the bottom wall portion 15a). The compression part 18 compresses the refrigerant taken through the inlet 14a by rotation of the rotary shaft 17, and discharges the compressed refrigerant through the outlet 14b. It is noted that a specific configuration of the compression part 18 may be an arbitrary configuration such as a scroll type, a piston type, and a vane type.

The electric motor 19 is disposed between the compression part 18 and the bottom wall portion 15a. The electric motor 19 drives the compression part 18 by rotating the rotary shaft 17. The electric motor 19 has, for example, a rotor 20 that is formed in a cylindrical shape and fixed to the rotary shaft 17, and a stator 21 that is fixed to the housing 14. The stator 21 has a stator core 22 that is formed in a cylindrical shape and a coil 23 that is wound around teeth formed in the stator core 22. The rotor 20 and the stator 21 face each other in a radial direction of the rotary shaft 17. The rotor 20 and the rotary shaft 17 are rotated by electrifying the coil 23, by which the refrigerant is compressed by the compression part 18.

As illustrated in FIG. 1, the vehicle electric compressor 11 includes a driving device 24 to which DC power is input to drive the electric motor 19, and an inverter housing 25 which cooperates with the bottom wall portion 15a to form an accommodation chamber S0 in which the driving device 24 is accommodated.

The inverter housing 25 is made of a non-magnetic conductive material that has thermal conductivity, for example, metal such as aluminum.

The inverter housing 25 is formed in a bottomed cylindrical shape and opens toward the bottom wall portion 15a of the suction housing 15. The inverter housing 25 is attached to the bottom wall portion 15a by bolts 26 with an opening end of the inverter housing 25 in contact with the bottom wall portion 15a. An opening of the inverter housing 25 is sealed by the bottom wall portion 15a. The inverter housing 25 and the bottom wall portion 15a form the accommodation chamber S0.

The accommodation chamber S0 is located on the opposite side of the bottom wall portion 15a relative to the electric motor 19. The compression part 18, the electric motor 19, and the driving device 24 are arranged in the axial direction of the rotary shaft 17.

The inverter housing 25 has a connector 27, and the driving device 24 is electrically connected to the connector 27. Through the connector 27, DC power is input to the driving device 24 from a vehicle storage device 28 mounted on the vehicle through the connector 27, and the air conditioning ECU 13 and the driving device 24 are electrically connected. The vehicle storage device 28 is a DC power source that is mounted on the vehicle, such as a secondary battery and a capacitor.

As illustrated in FIG. 1, a circuit board 29 is disposed in the accommodation chamber S0. The circuit board 29 is formed in a plate shape. The circuit board 29 and the bottom wall portion 15a are spaced a specified distance apart in the axial direction of the rotary shaft 17 and face each other. The driving device 24 has an inverter device 30, and a first connection line EL1 and a second connection line EL2 that are used to electrically connect the inverter device 30 to the connector 27. The driving device 24 is formed by using the circuit board 29. The compression part 18, the electric motor 19, and the inverter device 30 are accommodated in the housing 14 made of metal.

The inverter device 30 is used to drive the electric motor 19. The inverter device 30 includes an inverter circuit 31 (see FIG. 2), a noise reduction unit 32 (see FIG. 2), and the circuit board 29. The inverter circuit 31 and the noise reduction unit 32 are mounted on the circuit board 29. The inverter circuit 31 is used to convert DC power to AC power. The noise reduction unit 32 is connected to an input side of the inverter circuit 31 and reduces a common mode noise and a normal mode noise in a DC current to be input to the inverter circuit 31.

The following will describe an electrical configuration of the electric motor 19 and the driving device 24.

Figure 2:
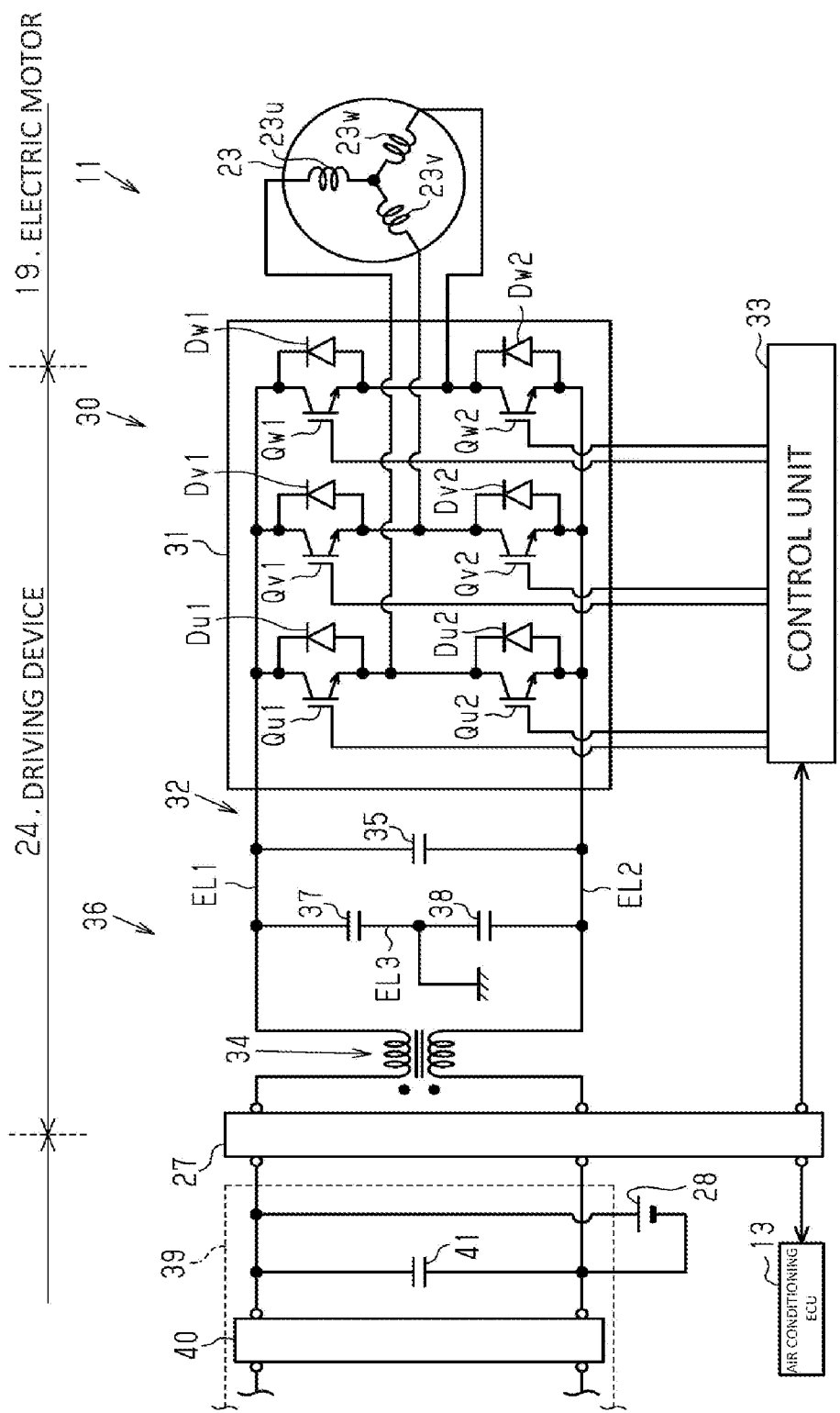
FIG. 2 is a circuit diagram of a driving device and an electric motor of FIG. 1.

As illustrated in FIG. 2, the coil 23 of the electric motor 19 has a three phase structure that has, for example, a u-phase coil 23u, a v-phase coil 23v, and a w-phase coil 23w. The coils 23u to 23w are, for example, Y-connected.

The inverter circuit 31 includes u-phase switching elements Qu1, Qu2 corresponding to the u-phase coil 23u, v-phase switching elements Qv1, Qv2 corresponding to the v-phase coil 23v, and w-phase switching elements Qw1, Qw2 corresponding to the w-phase coil 23w. A power switching element such as IGBT is used as each of the switching elements Qu1 to Qw2. It is noted that the switching elements Qu1 to Qw2 have freewheeling diodes (body diodes) Du1 to Dw2, respectively.

The u-phase switching elements Qu1, Qu2 are connected in series through a connection line which is connected to the u-phase coil 23u. A series-connected body of the u-phase switching elements Qu1, Qu2 is electrically connected to both of the connection lines EL1, EL2. The DC power from the vehicle storage device 28 is input to the above-described series-connected body.

It is noted that the other switching elements Qv1, Qv2, Qw1, Qw2 are connected in the same manner as the u-phase switching elements Qu1, Qu2, except only that the corresponding coils each connected to the switching elements Qv1, Qv2, Qw1, Qw2 are different from that of the switching elements Qu1, Qu2.

The driving device 24 includes a control unit 33 that controls a switching operation of each of the switching elements Qu1 to Qw2. The control unit 33 is constituted by, for example, one or more dedicated hardware circuits, and/or one or more processors (control circuits) that are operated in accordance with computer programs (software). The processor includes a CPU and a memory such as a RAM and a ROM. The memory stores program codes or commands by which, for example, the processor executes a variety of processes. The memory, that is, a computer-readable medium herein refers to every applicable medium to which a general-purpose or dedicated computer is accessible.

The control unit 33 is electrically connected to the air conditioning ECU 13 through the connector 27, and periodically turns on and off each of the switching elements Qu1 to Qw2 in accordance with commands from the air conditioning ECU 13. In detail, the control unit 33 controls each of the switching elements Qu1 to Qw2 by a pulse width modulation control (PWM control) in accordance with the commands from the air conditioning ECU 13. More specifically, the control unit 33 generates control signals by using a carrier signal (carrier wave signal) and command voltage signals (reference signals). The control unit 33 performs an ON/OFF control of each of the switching elements Qu1 to Qw2 by using the generated control signals to convert the DC power to the AC power.

The noise reduction unit 32 includes the circuit board 29 (see FIG. 1), a common mode choke coil 34 that is mounted on the circuit board 29, and an X capacitor 35 that is mounted on the circuit board 29. The X capacitor 35 as a smoothing capacitor cooperates with the common mode choke coil 34 to form a low pass filter circuit 36. The low pass filter circuit 36 is connected to the connection lines EL1 and EL2. The low pass filter circuit 36 is connected between the connector 27 and the inverter circuit 31 in the electrical circuit.

The common mode choke coil 34 is connected to the connection lines EL1 and EL2.

The X capacitor 35 is connected in an output stage of the common mode choke coil 34 (electrically closer to the inverter circuit 31) and electrically connected to the connection lines EL1 and EL2. The common mode choke coil 34 cooperates with the X capacitor 35 to form a LC resonance circuit. That is, the low pass filter circuit 36 of the present embodiment is the LC resonance circuit that includes the common mode choke coil 34.

Y capacitors 37, 38 are connected in series with each other. In detail, the driving device 24 includes a bypass line EL3 that connects a first end of a first Y capacitor 37 to a first end of a second Y capacitor 38. The bypass line EL3 is electrically grounded to the body of the vehicle.

In addition, a series-connected body of both of the Y capacitors 37, 38 is connected between the X capacitor 35 and the common mode choke coil 34, and electrically connected to the common mode choke coil 34. A second end of the first Y capacitor 37 opposite the first end thereof is connected to the first connection line EL1, or, more specifically, a node at which a first winding wire of the common mode choke coil 34 and the inverter circuit 31 are connected in the first connection line EL1. A second end of the second Y capacitor 38 opposite the first end thereof is connected to the second connection line EL2, or, more specifically, a node at which a second winding wire of the common mode choke coil 34 and the inverter circuit 31 are connected in the second connection line EL2.

A PCU (power control unit) 39 as an example of a vehicle equipment is provided separately from the driving device 24 on the vehicle. The PCU 39 drives a traveling motor, or the like that is mounted on the vehicle by using DC power supplied from the vehicle storage device 28. That is, in the present embodiment, the PCU 39 and the driving device 24 are connected in parallel with the vehicle storage device 28, that is, the vehicle storage device 28 is shared between the PCU 39 and the driving device 24.

The PCU 39 includes, for example, a boost converter 40 that has a boost switching element and raises the DC power of the vehicle storage device 28 by turning on and off the boost switching element periodically, and a power supply capacitor 41 that is connected in parallel with the vehicle storage device 28. In addition, the PCU 39 includes a travelling inverter (not illustrated) that converts the DC power raised by the boost converter 40 to drive power by which the traveling motor is driven.

In such a configuration, noise caused by the switching of the boost switching element enters into the driving device 24 as a normal mode noise. In other words, the normal mode noise has a noise component corresponding to a switching frequency of the boost switching element.

The following will describe a configuration of the common mode choke coil 34 with reference to FIGS. 3A, 3B, 3C, 4, 5A, 5B, 5C, 6, 7A, 7B, 7C, 8, 9A, and 9B.

It is noted that a three-axis orthogonal coordinate is specified in the drawings. In the present embodiment, an axial direction of the rotary shaft 17 in FIG. 1 is defined as a Z-direction, and directions orthogonal to the Z-direction are defined as an X-direction and a Y-direction.

As illustrated in FIGS. 5A, 5B, 5C and 6, the common mode choke coil 34 includes a core 50, a case 60, a first winding wire 70, a second winding wire 71, and a metal plate 80 as an annular electrical conductor. The winding wires 70, 71 are wound around the case 60 in which the core 50 is accommodated. The common mode choke coil 34 is used with the metal plate 80 looped over the winding wires 70, 71. The first winding wire 70 and the second winding wire 71 correspond to a pair of winding wires in the common mode choke coil 34, and are wound around the core 50.

Figure 5C:
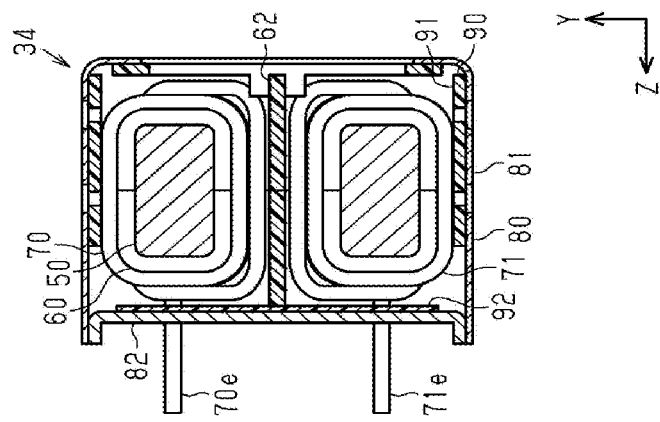
FIG. 5C is a cross-sectional view taken along a line VC-VC of FIG. 5A.
Figure 5A:
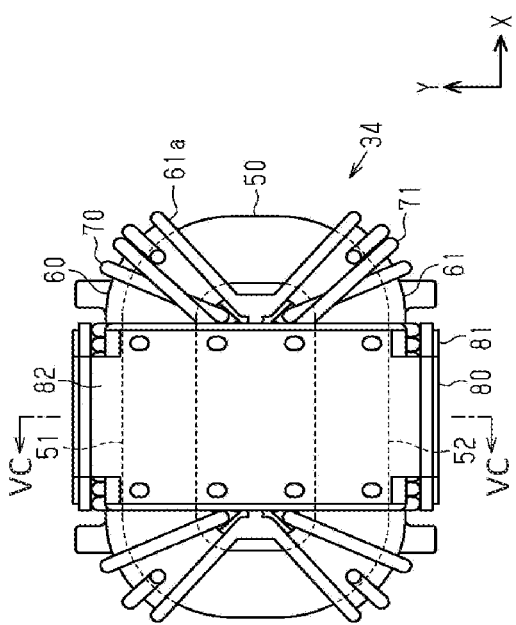
FIG. 5A is a plan view of the common mode choke coil.
Figure 5B:
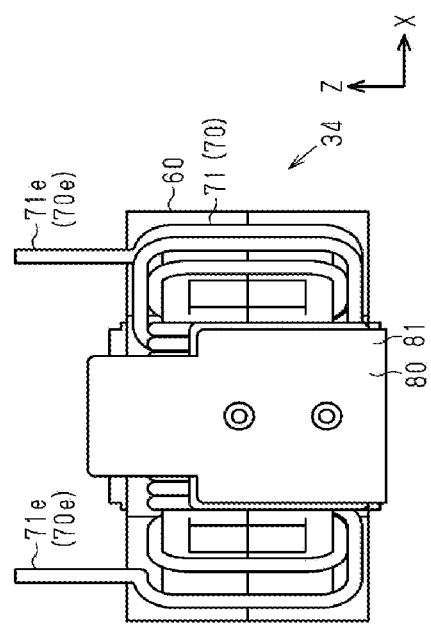
FIG. 5B is a front view of the common mode choke coil.

As illustrated in FIGS. 5A, 5B, and 5C, the core 50 is accommodated in the case 60. The core 50 has a cross-sectional shape of a quadrangle as illustrated in FIG. 5C, and has an annular shape of a substantially rectangle as a whole in an X-Y plane illustrated in FIG. 5A.

Figure 6:
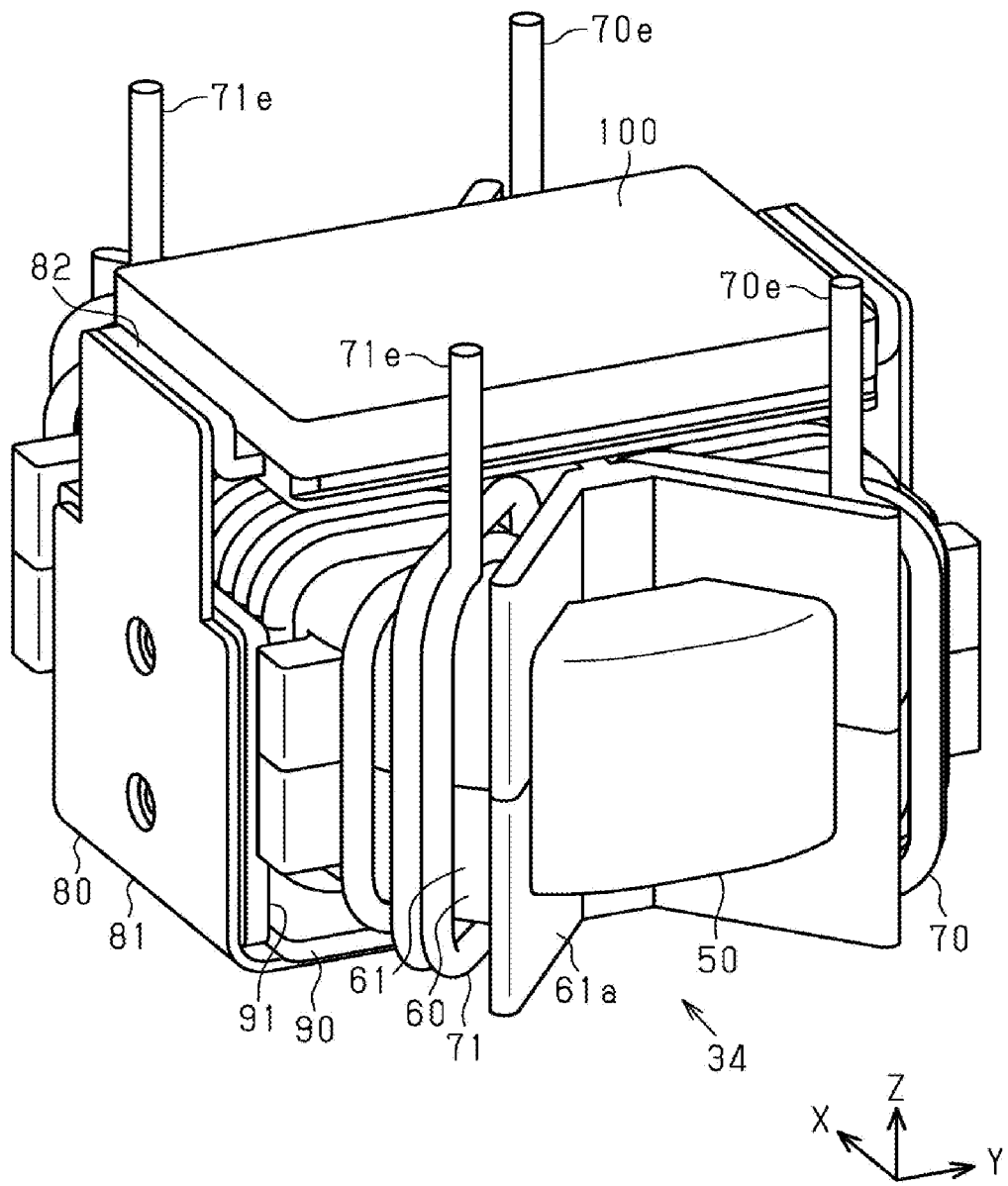
FIG. 6 is a perspective view of the common mode choke coil.

As illustrated in FIGS. 5A, 5B and 5C, the case 60 has an annular shape and electrical insulating property, and is made of resin. The case 60 includes a main body portion 61 that has an opening 61a, and a wall 62. The main body portion 61 excluding the opening 61a (see FIG. 6) covers an entire portion of the core 50. The winding wires 70, 71 are wound around the main body portion 61 as illustrated in FIGS. 5A, 5B, and 5C. The opening 61a in FIG. 6 is disposed between the winding wires 70, 71. A portion of the core 50 that is located between the winding wires 70, 71 is exposed outside the case 60 through the opening 61a.

The wall 62 is located on an inner peripheral surface side of the core 50 between the winding wires 70, 71, and formed to extend in the Z-direction. The winding wires 70, 71 are separated by the wall 62.

As illustrated in FIGS. 5A, 5B, and 5C, the first winding wire 70 is wound around an outer surface of the case 60. The second winding wire 71 is wound around the outer surface of the case 60. In detail, the core 50 includes a first straight line portion 51 and a second straight line portion 52 which extend straight in parallel with each other. At least one portion of the first winding wire 70 is wound around the first straight line portion 51. At least one portion of the second winding wire 71 is wound around the second straight line portion 52. Winding directions of both of the winding wires 70, 71 are mutually opposite directions. In addition, the first winding wire 70 and the second winding wire 71 are separated away and face each other.

As illustrated in FIGS. 5A, 5B, 5C, 6, 7A, 7B, and 7C, the metal plate 80 as the annular electrical conductor is formed in a strip shape and an endless-loop shape. The annular metal plate 80 covers the core 50 and the case 60 while looped over the first winding wire 70 and the second winding wire 71. This means that the metal plate 80 covers both of the first winding wire 70 and the second winding wire 71. Portions of the metal plate 80 that are located between the first winding wire 70 and the second winding wire 71 are separated and face each other. The metal plate 80 as the annular electrical conductor partially faces the metal plate 80 itself through a hole which is located inside the core 50 that is formed in the annular shape. The metal plate 80 covers at least a portion of each of the first winding wire 70 and the second winding wire 71 that is located in an outer circumferential side of the annular core 50.

As illustrated in FIGS. 3A, 3B, 3C, and 4, opposite ends 70e of the first winding wire 70 that is wound around one part of the core 50 protrude from the circuit board 29 through the through holes of the circuit board 29, and are soldered to the circuit board 29. The second winding wire 71 that is wound around the other part of the core 50 is separated from and faces the first winding wire 70. Opposite ends 71e of the second winding wire 71 protrude from the circuit board 29 through the through holes of the circuit board 29, and are soldered to the circuit board 29.

The ends 70e of the first winding wire 70 and the ends 71e of the second winding wire 71 are, by soldering, electrically connected to conductive patterns formed on the circuit board 29.

As illustrated in FIGS. 7A, 7B, 7C, and 8, the metal plate 80 is split into a first metal plate 81 and a second metal plate 82 in a circumferential direction of the metal plate 80. That is, the metal plate 80 as the annular electrical conductor is split into two of the first metal plate 81 as the first electrical conductor and the second metal plate 82 as the second electrical conductor in the circumferential direction. Blass plates that each have a surface plated with tin are used as the first metal plate 81 and the second metal plate 82. Tin plating is performed for corrosion resistance.

The first metal plate 81 has a main body portion 81a that extends straight in the X direction in the X-Y plane, and upright portions 81b, 81c that are bent and formed so as to extend in the Z direction from opposite ends of the main body portion 81a. The first metal plate 81 is formed by metal stamping.

The second metal plate 82 has a main body portion 82a that extends straight in the X direction in the X-Y plane, and upright portions 82b, 82c that are bent and formed so as to extend in the Z direction from opposite ends of the main body portion 82a. The second metal plate 82 is formed by metal stamping.

As illustrated in FIGS. 7A, 7B, and 7C, the upright portions 82b, 82c of the second metal plate 82 are disposed between the upright portion 81b and the upright portion 81c on an end side of each of the upright portions 81b, 81c of the first metal plate 81, respectively. The upright portion 81b and the upright portion 82b are welded while being in contact with each other, and the upright portion 81c and the upright portion 82c are welded while being in contact with each other. With this process, the first metal plate 81 and the second metal plate 82 cooperate to form an annular shape.

As illustrated in FIGS. 3A, 3B, and 3C, the second metal plate 82 is disposed so as to be held between the circuit board 29 and the core 50. The first metal plate 81 is disposed so as to cooperate with the circuit board 29 to hold the core 50 between the first metal plate 81 and the circuit board 29.

As illustrated in FIGS. 5A, 5B, 5C, 7A, 7B, and 7C, resin members 90 as the insulator are interposed between the first metal plate 81 and the pair of winding wires 70, 71, and between the second metal plate 82 and the pair of winding wires 70, 71. That is, the resin members 90 as the insulator are interposed between the first metal plate 81 and the first winding wire 70, between the first metal plate 81 and the second winding wire 71, between the second metal plate 82 and the first winding wire 70, and between the second metal plate 82 and the second winding wire 71.

The resin members 90 as the insulator include first resin members 91 as a first insulator and a second resin member 92 as a second insulator.

As illustrated in FIGS. 5A, 5B, 5C, 7A, and 7B, the first resin members 91 are made of PPS (polyphenylene sulfide) resin, and disposed on a surface of the first metal plate 81 that faces the first winding wire 70 and a surface of the first metal plate 81 that faces the second winding wire 71. In detail, the first resin members 91 are disposed on a surface of the main body portion 81a of the first metal plate 81 that faces the main body portion 82a of the second metal plate 82, wherein the main body portion 82a of the second metal plate 82 is a surface that faces the winding wires 70, 71, a portion of the upright portion 81b of the first metal plate 81 that faces the first winding wires 70, and a portion of the upright portion 81c of the first metal plate 81 that faces the second winding wire 71. The first resin members 91 are molded and integrated into the first metal plate 81.

The second resin member 92 is made of PPS (polyphenylene sulfide) resin, and disposed on a surface of the main body portion 82a of the second metal plate 82 that faces the main body portion 81a of the first metal plate 81, that is, the surface that faces the first winding wire 70 and the second winding wire 71. The second resin member 92 is molded and integrated into the second metal plate 82. As illustrated in FIG. 4, the first metal plate 81 is thermally coupled to the bottom wall portion 15a of the housing 14.

Thus, the first metal plate 81 is thermally coupled to the housing 14, and disposed between the housing 14 and the pair of winding wires 70, 71. The second metal plate 82 is electrically connected to the first metal plate 81, and disposed between the circuit board 29 and the pair of winding wires 70, 71. An average value of electrical resistance of the first metal plate 81 per unit length in the circumferential direction of the metal plate 80 is larger than an average value of electrical resistance of the second metal plate 82 per unit length in the circumferential direction of the metal plate 80. Specifically, a plate thickness t1 of the first metal plate 81 (see FIG. 7C) is smaller than a plate thickness t2 of the second metal plate 82 (see FIG. 7C), so that the average value of the electrical resistance of the first metal plate 81 per unit length in the circumferential direction is larger than the average value of the electrical resistance of the second metal plate 82 per unit length in the circumferential direction. More specifically, for example, the second metal plate (brass plate) 82 closer to the circuit board 29 has a plate thickness of 0.64 mm, and the first metal plate (brass plate)

81 closer to the bottom wall portion 15a has a plate thickness of 0.3 mm. Since electrical resistance of an electrical conductor and heat generated in the electrical conductor are made larger by reducing a plate thickness of the electrical conductor, dissipating heat from the metal plate 80 closer to the bottom wall portion 15a improves a heat dissipation efficiency, and controlling a heating portion makes heat dissipation more efficient. In addition, when jointing the first metal plate 81 and the second metal plate 82 that have the same width, resistance values are adjustable without changing the widths of the first metal plate 81 and the second metal plate 82 by changing the plate thicknesses of the first metal plate 81 and the second metal plate 82. Accordingly, the first metal plate 81 and the second metal plate 82 are easily jointed to each other, and the manufacturing of the common mode choke coil 34 is facilitated.

Thus, an electrical resistance value of the first metal plate 81 closer to the bottom wall portion 15a is larger than an electrical resistance value of the second metal plate 82. The electrical resistance value of the whole first metal plate 81 is larger than the electrical resistance of the whole second metal plate 82.

As illustrated in FIGS. 3B, 3C, and 4, an insulator 100 is disposed between the circuit board 29 and the main body portion 82a of the second metal plate 82. The insulator 100 is made of resin plate, and attached on a surface of the main body portion 82a of the second metal plate 82 that faces the circuit board 29.

As illustrated in FIG. 5A, short side portions of the core 50 formed in a rectangular shape (annular shape) are uncovered portions that are not covered by the metal plate 80.

As illustrated in FIGS. 7A, 7B, 7C, and 8, the first metal plate 81 has a through hole 110. With this configuration, the first metal plate 81 and the second metal plate 82 have the same width and different plane shapes. A cross-sectional area of the first metal plate 81 in the circumferential direction of the metal plate 80 is smaller than a cross-sectional area of the second metal plate 82 in the circumferential direction of the metal plate 80. As a result, the average value of the electrical resistance of the first metal plate 81 per unit length in the circumferential direction is larger than the average value of the electrical resistance of the second metal plate 82 per unit length in the circumferential direction. In detail, in the first metal plate 81, an average value of electrical resistance of the main body portion 81a in the circumferential direction is larger than an average value of electrical resistance of each of the upright portions 81b, 81c in the circumferential direction.

Figure 8:
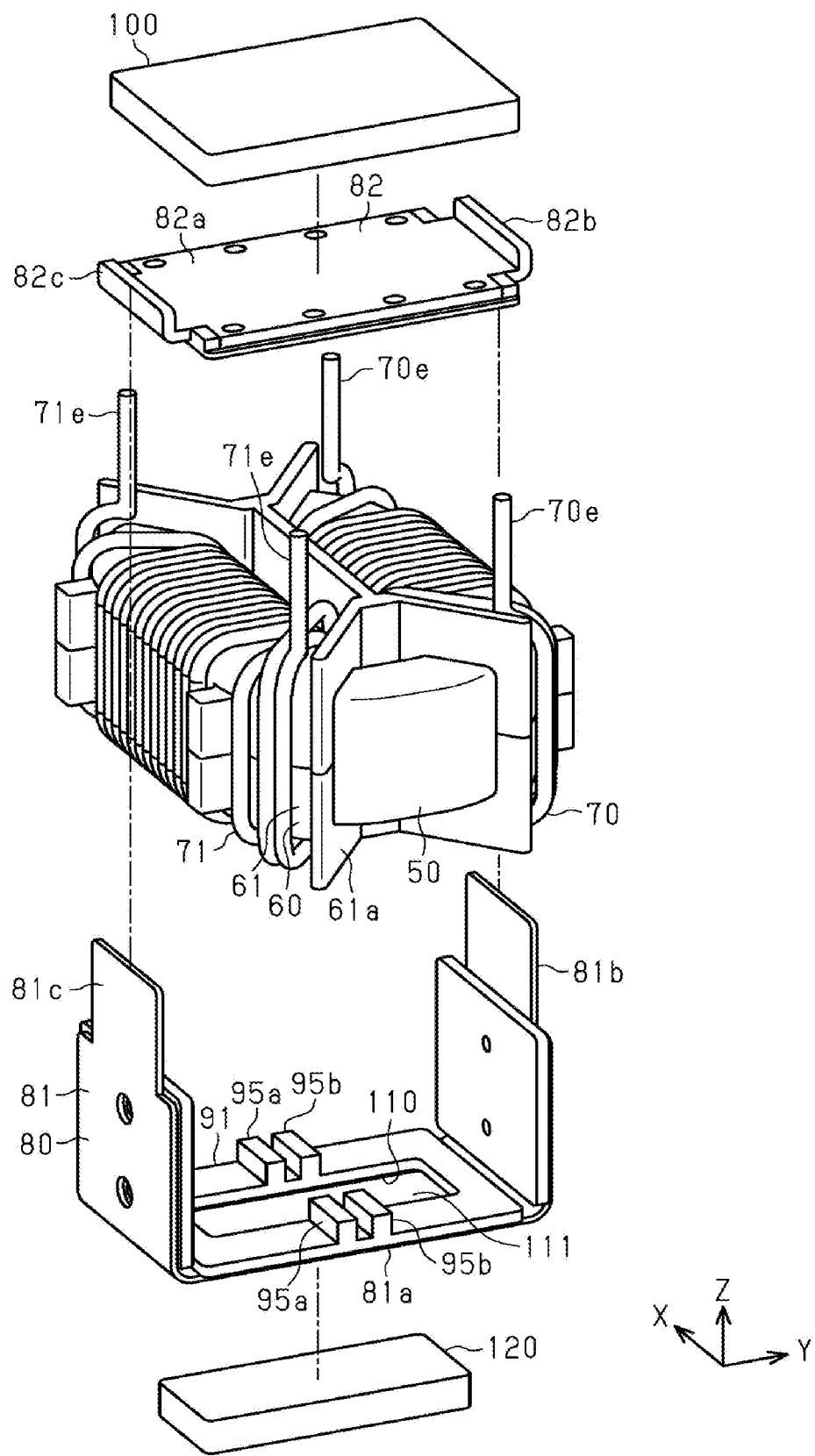
FIG. 8 is an exploded perspective view of the common mode choke coil.

The through hole 110 is formed in a middle portion of the main body portion 81a of the first metal plate 81 in a width direction (X direction) thereof, and extends in the circumferential direction (Y direction) of the metal plate 80. A through hole 111 is formed in a portion of the first resin member 91 corresponding to the through hole 110. As illustrated in FIGS. 4 and 8, a heat dissipation member 120 is filled in the through hole 110 and the through hole 111. The heat dissipation member 120 is a resin adhesive agent by which the first metal plate 81 and the housing 14 are bonded to each other. The heat dissipation member 120 is cured to be attached to the bottom wall portion 15a.

That is, the heat dissipation member 120 is disposed on a facing surface of the winding wires 70, 71 that faces the bottom wall portion 15a of the suction housing 15. Thus, the winding wires 70, 71 are thermally coupled to the suction housing 15 and indeed to the housing 14.

As illustrated in FIG. 8, the first resin member 91 has two pairs of projections 95a, 95b that engage with the wall 62 of the case 60. The projections 95a, 95b are disposed in a middle portion on an upper surface of a portion of the first resin member 91 corresponding to the main body portion 81a of the first metal plate 81. As illustrated in FIG. 4, the wall 62 of the case 60 is engaged with the pairs of projections 95a, 95b, by which the positions of the winding wires 70, 71 are determined.

The following will describe a manufacture of the common mode choke coil 34 of the present embodiment.

As illustrated in FIGS. 5A, 5B, and 5C, the core 50 is accommodated in the case 60, and the first winding wire 70 and the second winding wire 71 are wound around the case 60. On the other hand, as illustrated in FIGS. 7A, 7B, and 7C, the first metal plate 81 is integrally fixed to the first resin member 91. The second metal plate 82 is integrated with and fixed to the second resin member 92.

As illustrated in FIG. 6, the winding wires 70, 71 are disposed so as to be held between the first metal plate 81 and the second metal plate 82. In this time, end portions of the first metal plate 81 are each brought into contact on its contact side with a contact side of the end portions of the second metal plate 82. In this state, the end portions of the first metal plate 81 and the end portions of the second metal plate 82 are welded.

Subsequently, as illustrated in FIGS. 3A, 3B, 3C, and 4, the ends 70e, 71e of the pair of winding wires 70, 71 are inserted into the circuit board 29, wherein the insulator 100 is disposed between the winding wires 70, 71 and the circuit board 29. In this time, the ends 70e of the first winding wire 70 and the ends 71e of the second winding wire 71 are protruded from the circuit board 29. Then, the ends 70e of the first winding wire 70 and the ends 71e of the second winding wire 71 that are protruded from the circuit board 29 are soldered to the circuit board 29.

The following will describe an operation according to the present embodiment.

Firstly, a normal mode (differential mode) will be described by using FIGS. 9A and 9B.

Figure 9A:
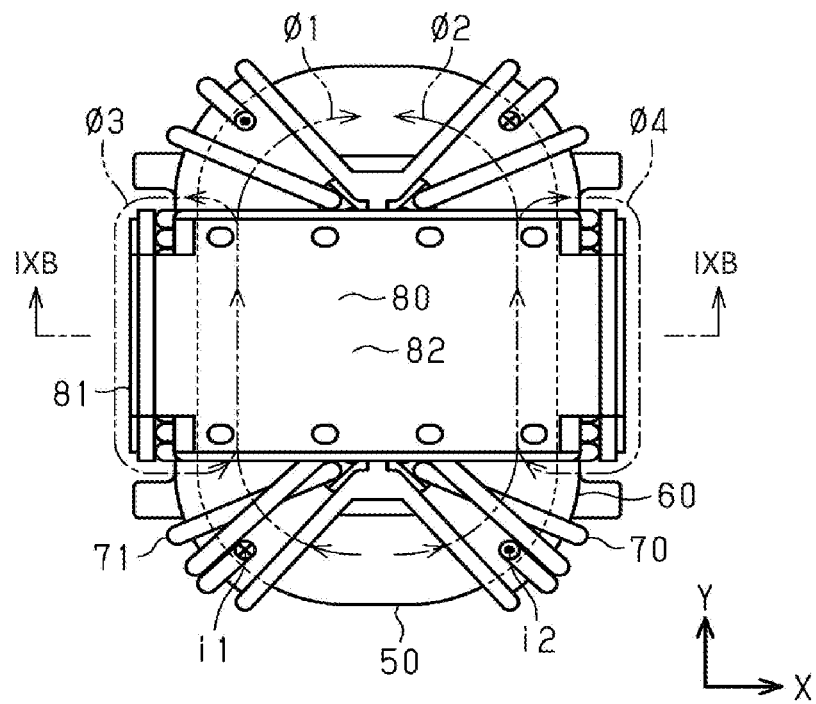
FIG. 9A is a plan view of the common mode choke coil for an explanation of an operation according to the embodiment of the present disclosure.
Figure 9B:
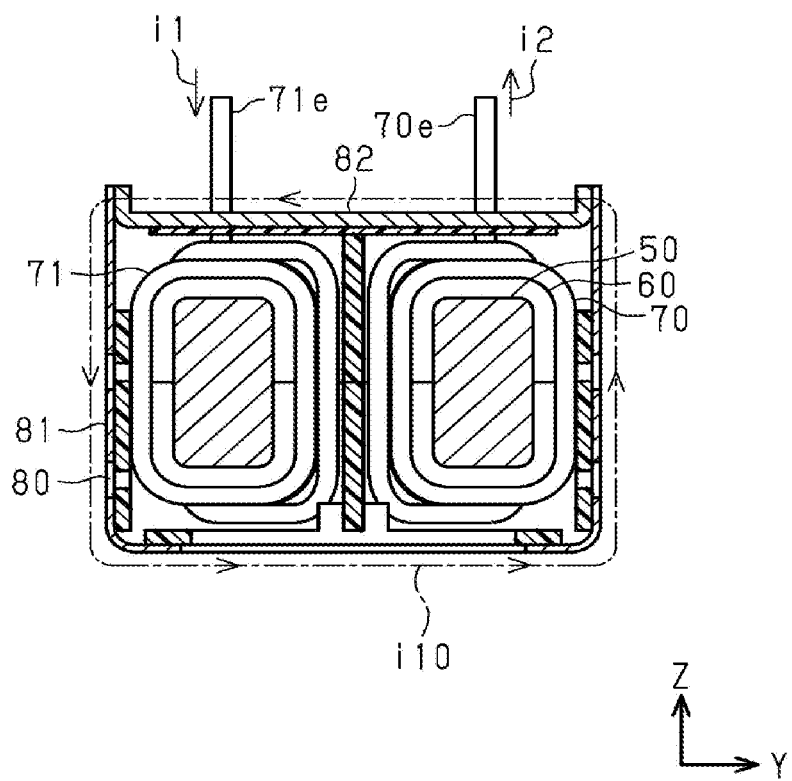
FIG. 9B is a cross-sectional view taken along a line IXB-IXB of FIG. 9A.

As illustrated in FIG. 9A, when the first winding wire 70 and the second winding wire 71 are energized, currents i1, i2 flow through the first winding wire 70 and the second winding wire 71, respectively. In response to the currents i1, i2 flowing through the winding wires 70, 71, magnetic fluxes φ1, φ2 are generated in the core 50. The magnetic fluxes φ1, φ2 are oriented in the opposite directions to each other, thereby generating leakage magnetic fluxes φ3, φ4. Here, as illustrated in FIG. 9B, an induced current i10 flows in the metal plate 80 in a circumferential direction thereof so as to generate a magnetic flux which flows in a direction against the generating leakage magnetic fluxes φ3, φ4.

Thus, in the metal plate 80, the induced current (eddy current) i10 flows in the circumferential direction of the metal plate 80 so as to generate the magnetic flux in the direction against the leakage magnetic fluxes that are generated with the energizing of the first winding wire 70 and the second winding wire 71. The induced current flowing in the circumferential direction herein refers to the induced current flowing around the core 50.

In a common mode, the currents flow in the same direction as each other through the first winding wire 70 and the second winding wire 71 by the energizing of the first winding wire 70 and the second winding wire 71. Magnetic fluxes in the same direction as each other are generated in the core 50 in response to the currents flowing through the first winding wire 70 and the second winding wire 71. Thus, when a common mode current flows, the magnetic fluxes are generated in the core 50 and few leakage magnetic fluxes are generated, so that a common impedance is maintained.

The current flows in the metal plate 80 that is formed in the strip shape and the endless-loop shape so as to generate the magnetic flux in the direction against the leakage magnetic fluxes, and power is consumed to generate heat. The heat Q (see FIG. 4) generated in the common mode choke coil 34 is dissipated into the bottom wall portion 15a through the heat dissipation member 120 in the through hole 110 and the through hole 111. That is, the pair of winding wires 70, 71 are thermally connected to the bottom wall portion 15a, so that the heat Q generated in the pair of winding wires 70, 71 escapes into the bottom wall portion 15a. Thus, the heat Q generated in the pair of winding wires 70, 71 escapes through the heat dissipation member 120, so that the common mode choke coil 34 is superior in the heat dissipation performance to the heat dissipation surface.

Thus, the metal plate 80 as the electrical conductor is split into two, and is constituted by two parts, so that an average value of the electrical resistance of the first metal plate 81 is larger than that of the second metal plate 82. Specifically, the second metal plate 82 made of brass has the plate thickness t2 of 0.64 mm, and the first metal plate 81 made of brass has the plate thickness t1 of 0.3 mm. In this configuration, the electrical resistance value of the first metal plate 81 that has a smaller cross-sectional area than that of the second metal plate 82 is larger than the electrical resistance value of the second metal plate 82. Heat is concentrated by generating the heat in the first metal plate 81 that has the larger electrical resistance value. Thus, the heat is easily dissipated into the housing 14.

In addition, the through hole 110 is formed in the first metal plate 81, and the electrical resistance value of the first metal plate 81 that has the smaller cross-sectional area than that of the second metal plate 82 is larger than the electrical resistance value of the second metal plate 82. Heat is concentrated by generating the heat in the first metal plate 81 that has the larger electrical resistance value. Thus, the heat is easily dissipated into the housing 14. That is, the through hole 110 is formed in the first metal plate 81 closer to the heat dissipation member 120 to make the cross-sectional area of the first metal plate 81 smaller, thereby increasing the electrical resistance value of the first metal plate 81, so that the heat dissipation performance is improved.

The following will describe the detail of the operation according to the present embodiment.

In the present embodiment, the heat dissipation performance is improved by using a difference in the electrical resistance caused by the differences of the plate thickness and the plane shape.

The electrical conductor that is an annular metal foil covering the core as a conventional method has poor heat performance.

In the present embodiment, a difference in the electrical resistance value is generated by making differences of the plate thickness and the plane shape of the metal plate 80 that covers the core 50, so that the generated heat is concentrated on the portion of the metal plate 80 which has the higher electrical resistance. As a result, the heating portion of the metal plate 80 is controlled, and the common mode choke coil 34 cools off effectively.

That is, since a large current flows through the conventional metal foil that covers the core, a heat dissipation method has been an issue. In the present embodiment, a difference in electrical resistance value between the metal plates 81, 82 is generated by making a difference of the plate thicknesses between the metal plates 81, 82 and by forming the through hole 110 in the first metal plate 81 to make a difference of the plane shapes between the metal plates 81, 82, so that heat is concentrated on an arbitrary portion closer to the heat dissipation member 120. In addition, the cooling of the common mode choke coil 34 becomes more efficient by concentrating the heat on a cooling surface of the common mode choke coil 34.

According to the above-described embodiment, the following advantageous effects are obtained.

(1) The vehicle electric compressor 11 as the electric compressor includes the compression part 18 that compresses the fluid, the electric motor 19 that drives the compression part 18, the inverter device 30 that drives the electric motor 19, and the housing 14 that is made of metal and accommodates the compression part 18, the electric motor 19, and the inverter device 30. The inverter device 30 includes the inverter circuit 31, the noise reduction unit 32 that is connected to the input side of the inverter circuit 31 and reduces a common mode noise and a normal mode noise in the DC current that is to be input to the inverter circuit 31, and the circuit board 29 on which the inverter circuit 31 and the noise reduction unit 32 are mounted. The noise reduction unit 32 includes the common mode choke coil 34 and the X capacitor 35 as the smoothing capacitor that cooperates with the common mode choke coil 34 to form the low pass filter circuit 36. The common mode choke coil 34 includes the annular core 50, and the pair of winding wires 70, 71 wound around the core 50, and the metal plate 80 as the annular electrical conductor that covers the pair of winding wires 70, 71. The metal plate 80 is split into the first metal plate 81 and the second metal plate 82 in the circumferential direction of the metal plate 80. The first metal plate 81 is thermally coupled to the housing 14 and disposed between the housing 14 and the pair of winding wires 70, 71. The second metal plate 82 is electrically connected to the first metal plate 81 and disposed between the circuit board 29 and the pair of winding wires 70, 71. The electrical resistance value of the first metal plate 81 is larger than that of the second metal plate 82. Thus, when the normal mode current flows in the common mode choke coil 34, the induced current flows in the metal plate 80 and is easily transformed into thermal energy, so that the common mode choke coil 34 is superior in a damping effect. The leakage magnetic fluxes generated from the pair of winding wires 70, 71 cross the cross-sectional area of the annular metal plate 80 in the circumferential direction thereof, by which the induced current in the circumferential direction easily flows in the metal plate 80. The electrical resistance value of the first metal plate 81 is larger than that of the second metal plate 82, so that the heat in the first metal plate 80 actively escapes toward the housing 14 by forming a portion of high temperature in the electrical conductor that is closer to the housing 14. As a result, the common mode choke coil 34 is superior in the heat dissipation performance.

(2) The plate thickness t1 of the first metal plate 81 is smaller than the plate thickness t2 of the second metal plate 82, so that the electrical resistance value of the first metal plate 81 is larger than that of the second metal plate 82. Thus, when the first metal plate 81 and the second metal plate 82 that have the same width are jointed to each other, the electrical resistance values are adjustable without changing the widths by changing the plate thicknesses of the first metal plate 81 and the second metal plate 82. Accordingly, the first metal plate 81 and the second metal plate 82 are easily jointed to each other, and the manufacturing of the common mode choke coil 34 is facilitated.

(3) The first metal plate 81 and the second metal plate 82 have different plane shapes, wherein the first metal plate 81 has a cross-sectional area in the circumferential direction of the electrical conductor 80 smaller than that of the second metal plate 82 in the circumferential direction, so that the electrical resistance value of the first metal plate 81 is larger than that of the second metal plate 82. Thus, the portion of high temperature in the electrical conductor that is closer to the housing is easily formed.

(4) The first metal plate 81 has the through hole 110. With this configuration, heat of the winding wires 70, 71 is dissipated through the through hole 110.

(5) The heat dissipation member 120 is filled in the through hole 110. With this configuration, heat of the winding wires 70, 71 is dissipated through the heat dissipation member 120.

(6) The heat dissipation member 120 is an adhesive agent by which the first metal plate 81 and the housing 14 are bonded to each other, and fixes the winding wires 70, 71.

The present disclosure is not limited to the above-described embodiment, and may be modified as follows.

A material that has a higher resistance for the first metal plate 81 than the material for the second metal plate 82 may be used to make the average value of the electrical resistance of the first metal plate 81 per unit length in the circumferential direction of the metal plate 80 larger than that of the second metal plate 82 per unit length in the circumferential direction of the metal plate 80. For example, a brass plate is used as the first metal plate 81, and a phosphor bronze plate is used as the second metal plate 82. Thus, the material of the first metal plate 81 may have higher electrical resistance than that of the second metal plate 82 to make the electrical resistance value of the first metal plate (81) larger than that of the second metal plate (82).

The metal plate 80 may be formed from not only a brass plate but also an aluminum plate, a stainless steel plate, etc.

Instead of the resin members 91, 92 as the insulator, electrically insulating coating may be used for insulation of the metal plates 81, 82 from the winding wires 70, 71. For example, resin coating layers may be formed on surfaces of the metal plates 81, 82 that face the winding wires 70, 71.

As long as an enough distance is ensured between the first metal plate 81 and the winding wires 70, 71, the first resin member 91 as the first insulator may be eliminated. Similarly to the first resin member 91, as long as an enough distance is ensured between the second metal plate 82 and the winding wires 70, 71, the second resin member 92 as the second insulator may be eliminated. In addition, as long as an enough distance is ensured between the circuit board 29 and the second metal plate 82, the insulator 100 may be eliminated.

The average value of the electrical resistance of the first metal plate per unit length in the circumferential direction of the metal plate 80 is made larger than that of the second metal plate per unit length in the circumferential direction by the following configurations: the plate thickness t1 of the first metal plate 81 is smaller than the plate thickness t2 of the second metal plate 82; the cross-sectional area of the first metal plate 81 in the circumferential direction of the metal plate 80 is made smaller than that of the second metal plate 82 in the circumferential direction by making a difference between the plane shape of the first metal plate 81 and the plane shape of the second metal plate 82; and the material of the first metal plate 81 has a higher resistance than that of the second metal plate 82. This may be performed by only one, by combining arbitrary two, or by all, of the above configurations.

What is claimed is:

1. An electric compressor, comprising:
a compression part that compresses fluid;
an electric motor that drives the compression part;
an inverter device that drives the electric motor, and
a housing that is made of metal and accommodates the compression part, the electric motor, and the inverter device,
the inverter device including:
an inverter circuit;
a noise reduction unit that is connected to an input side of the inverter circuit and reduces a common mode noise and a normal mode noise in a DC current that is to be input to the inverter circuit; and
a circuit board on which the inverter circuit and the noise reduction unit are mounted,
the noise reduction unit including:
a common mode choke coil; and
a smoothing capacitor that cooperates with the common mode choke coil to form a low pass filter circuit,
the common mode choke coil including:
an annular core;
a pair of winding wires wound around the core; and
an annular electrical conductor that covers the pair of the winding wires, wherein
the electrical conductor is split into a first metal plate and a second metal plate in a circumferential direction of the electrical conductor,
the first metal plate is thermally coupled to the housing and disposed between the housing and the pair of the winding wires,
the second metal plate is electrically connected to the first metal plate and disposed between the circuit board and the pair of the winding wires, and
an electrical resistance value of the first metal plate is larger than that of the second metal plate.

2. The electric compressor according to claim 1, wherein a plate thickness of the first metal plate is smaller than a plate thickness of the second metal plate, so that the electrical resistance value of the first metal plate is larger than that of the second metal plate.

3. The electric compressor according to claim 1, wherein the first metal plate and the second metal plate have different plane shapes, wherein the first metal plate has a cross-sectional area in the circumferential direction of the electrical conductor smaller than that of the second metal plate in the circumferential direction, so that the electrical resistance value of the first metal plate is larger than that of the second metal plate.

4. The electric compressor according to claim 1, wherein a material of the first metal plate has higher electrical resistance than that of the second metal plate, so that the electrical resistance value of the first metal plate is larger than that of the second metal plate.

5. The vehicle electric compressor according to claim 1, wherein
the first metal plate has a through hole.

6. The electric compressor according to claim 5, wherein a heat dissipation member is filled in the through hole.

7. The electric compressor according to claim 6, wherein the heat dissipation member is an adhesive agent by which the first metal plate and the housing are bonded to each other.

* * * * *